(12) United States Patent
Bang et al.

(10) Patent No.: US 9,320,130 B2
(45) Date of Patent: Apr. 19, 2016

(54) PRINTED CIRCUIT BOARD, AND BOARD BLOCK FOR VEHICLES USING THE SAME

(75) Inventors: Ick Jong Bang, Incheon (KR); Jung Young Kwag, Incheon (KR)

(73) Assignee: KOREA ELECTRIC TERMINAL CO., LTD., Incheon (KR)

( * ) Notice: Subject to any disclaimer, the term of this patent is extended or adjusted under 35 U.S.C. 154(b) by 307 days.

(21) Appl. No.: 13/879,208

(22) PCT Filed: Jun. 7, 2011

(86) PCT No.: PCT/KR2011/004159
§ 371 (c)(1),
(2), (4) Date: Apr. 12, 2013

(87) PCT Pub. No.: WO2012/057428
PCT Pub. Date: May 3, 2012

(65) Prior Publication Data
US 2013/0208432 A1     Aug. 15, 2013

(30) Foreign Application Priority Data

Oct. 25, 2010  (KR) .................. 10-2010-0103973
Nov. 18, 2010  (KR) .................. 10-2010-0114941
Nov. 30, 2010  (KR) .................. 10-2010-0120763

(51) Int. Cl.
| | |
|---|---|
| *H05K 1/02* | (2006.01) |
| *B60R 16/023* | (2006.01) |
| *H05K 1/05* | (2006.01) |
| *H05K 1/03* | (2006.01) |
| *H05K 1/18* | (2006.01) |

(52) U.S. Cl.
CPC .......... *H05K 1/0201* (2013.01); *B60R 16/0238* (2013.01); *H05K 1/02* (2013.01); *H05K 1/0278* (2013.01); *H05K 1/0296* (2013.01); *H05K 1/0306* (2013.01); *H05K 1/056* (2013.01); *H05K 1/181* (2013.01)

(58) Field of Classification Search
CPC ....... H05K 1/0201; H05K 1/02; H05K 1/181; H05K 1/0296; H05K 1/0306
See application file for complete search history.

(56) References Cited

U.S. PATENT DOCUMENTS

| | | | | |
|---|---|---|---|---|
| 4,965,702 A | * | 10/1990 | Lott et al. ................. | 361/764 |
| 5,448,511 A | * | 9/1995 | Paurus et al. ............. | 365/52 |
| 5,452,182 A | * | 9/1995 | Eichelberger et al. .... | 361/749 |

(Continued)

FOREIGN PATENT DOCUMENTS

| | | |
|---|---|---|
| JP | 59-188191 A | 10/1984 |
| JP | 03-157984 A | 7/1991 |

(Continued)

OTHER PUBLICATIONS

International Search Report for PCT/KR2011/004159 mailed Dec. 27, 2011 from Korean Intellectual Property Office.

*Primary Examiner* — Hoa C Nguyen
*Assistant Examiner* — Xanthia C Cunningham
(74) *Attorney, Agent, or Firm* — Paratus Law Group, PLLC

(57) ABSTRACT

Disclosure relates to a printed circuit board, and a board block for vehicles using the same. A housing forms an outer appearance of the board block of the present invention. The housing includes a housing body and a housing cover. An interior space is formed in the housing body, and a first connector is integrally formed with one side of an upper end of the housing body. The housing cover covers the upper end of the housing body and a first connector unit.

18 Claims, 11 Drawing Sheets

(56) References Cited

U.S. PATENT DOCUMENTS

| | | | | |
|---|---|---|---|---|
| 5,461,202 A | * | 10/1995 | Sera et al. | 174/254 |
| 5,581,877 A | * | 12/1996 | Woychik et al. | 29/852 |
| 5,646,446 A | * | 7/1997 | Nicewarner et al. | 257/723 |
| 5,991,162 A | * | 11/1999 | Saso | 361/760 |
| 6,007,351 A | * | 12/1999 | Gabrisko et al. | 439/76.2 |
| 6,040,624 A | * | 3/2000 | Chambers et al. | 257/692 |
| 6,204,454 B1 | * | 3/2001 | Gotoh et al. | 174/255 |
| 6,220,876 B1 | * | 4/2001 | Avila et al. | 439/76.2 |
| 6,326,559 B1 | * | 12/2001 | Yoshioka et al. | 174/261 |
| 6,496,377 B1 | * | 12/2002 | Happ | B60R 16/0238 361/739 |
| 6,571,467 B2 | * | 6/2003 | Haze et al. | 29/852 |
| 6,599,135 B2 | * | 7/2003 | Yamane | 439/76.2 |
| 6,600,222 B1 | * | 7/2003 | Levardo | 257/686 |
| 6,614,664 B2 | * | 9/2003 | Lee | 361/784 |
| 6,767,616 B2 | * | 7/2004 | Ooi et al. | 428/209 |
| 6,870,096 B2 | * | 3/2005 | Suzuki et al. | 174/50 |
| 6,927,344 B1 | * | 8/2005 | Gall et al. | 174/254 |
| 7,292,453 B2 | * | 11/2007 | Naruse | 361/784 |
| 7,465,172 B2 | * | 12/2008 | Ishiguro et al. | 439/76.2 |
| 7,505,283 B2 | * | 3/2009 | Naimi et al. | 361/761 |
| 7,566,230 B2 | * | 7/2009 | Ozawa et al. | 439/76.2 |
| 7,606,050 B2 | * | 10/2009 | Cady et al. | 361/783 |
| 7,719,851 B2 | * | 5/2010 | Tuominen et al. | 361/761 |
| 7,733,632 B2 | * | 6/2010 | Ito | 361/626 |
| 7,883,342 B2 | * | 2/2011 | Yoshida et al. | 439/76.2 |
| 7,950,930 B2 | * | 5/2011 | Yoshida et al. | 439/76.2 |
| 8,053,674 B2 | * | 11/2011 | Ooyabu et al. | 174/254 |
| 8,385,028 B2 | * | 2/2013 | Fouquet et al. | 361/1 |
| 2003/0109078 A1 | * | 6/2003 | Takahashi et al. | 438/106 |
| 2003/0168725 A1 | * | 9/2003 | Warner et al. | 257/686 |
| 2004/0021211 A1 | * | 2/2004 | Damberg | 257/686 |
| 2005/0221642 A1 | * | 10/2005 | Saka | 439/76.2 |
| 2006/0050496 A1 | * | 3/2006 | Goodwin | 361/803 |
| 2006/0125067 A1 | * | 6/2006 | Wehrly et al. | 257/679 |
| 2006/0128181 A1 | * | 6/2006 | Ishiguro et al. | 439/76.2 |
| 2006/0190673 A1 | * | 8/2006 | Arai et al. | 711/101 |
| 2006/0234528 A1 | * | 10/2006 | Nakano et al. | 439/76.2 |
| 2007/0277998 A1 | * | 12/2007 | Suzuki et al. | 174/255 |
| 2008/0144260 A1 | * | 6/2008 | Honda | 361/679 |
| 2008/0254654 A1 | * | 10/2008 | Ito | 439/76.2 |
| 2008/0299798 A1 | * | 12/2008 | Yoshida et al. | 439/76.2 |
| 2009/0142940 A1 | * | 6/2009 | Ikeda | 439/76.2 |
| 2010/0103635 A1 | * | 4/2010 | Tuominen et al. | 361/764 |
| 2012/0033394 A1 | * | 2/2012 | Su et al. | 361/771 |
| 2012/0236230 A1 | * | 9/2012 | Nakahama et al. | 349/62 |

FOREIGN PATENT DOCUMENTS

| | | |
|---|---|---|
| JP | 03-157986 A | 7/1991 |
| JP | 7029585 B2 | 4/1995 |
| JP | 08-097556 A | 4/1996 |

\* cited by examiner

PRINTED CIRCUIT BOARD, AND BOARD BLOCK FOR VEHICLES USING THE SAME

CROSS REFERENCE TO PRIOR APPLICATION

This application is a National Stage Patent Application of PCT International Patent Application No. PCDKR2011/004159 (filed on Jun. 7, 2011) under 35 U.S.C. §371, which claims priority to Korean Patent Application Nos. 10-2010-0103973 (filed on Oct. 25, 2010), 10-2010-0114941 (filed on Nov. 18, 2010) and 10-2010-0120763 (filed on Nov. 30, 2010) which are all hereby incorporated by reference in their entirety.

TECHNICAL FIELD

The present disclosure relates to a printed circuit board and a board block for vehicles using the same. More particularly, embodiments of the present disclosure relate to a printed circuit board used in a board block for vehicles performing various functions necessary for a vehicle, and a board block for vehicles using the same.

BACKGROUND ART

In vehicles, it is necessary to supply and control power to various electric components. In order to collectively supply and control power to various electric components in this way, boxes such as a junction box, a joint box, and a battery box are used. Such a box is configured by integrating components such as fuses and relays, and circuit boards.

In recent years, board blocks which are installed in one box or separately equipped with a function of a box are often used. Such a board block performs substantially the same function as that of one box.

A plurality of printed circuit boards are used in the board block, and the printed circuit boards are disposed generally parallel to each other. In order to dispose the printed circuit boards in parallel, the printed circuit boards should be electrically connected by wires or jumper pins. Further, a structure for fixing the printed circuit boards should be provided separately. Thus, the board block according to the related art is relatively large and has a number of components.

Further, since connector units for electrical connections of printed circuit boards to the outside, respectively, cannot but be located at corresponding positions on a lower surface of a housing in the board block according to the related art, circuit patterns of the printed circuit boards become long. Accordingly, a voltage drop and significant amounts of heat are generated in a relatively long circuit pattern, and an entire size of the board block increases due to the large sizes of the printed circuit boards.

Meanwhile, the printed circuit boards are generally manufactured by forming circuit patterns in insulation layers which are formed of a synthetic resin. A separate insulation layer is formed to cover a circuit pattern formed on the insulation layer and a circuit pattern is formed again on a surface of the separate insulation layer. Such a printed circuit board is referred to as a multilayered printed circuit pattern. Of course, circuit patterns may be formed on opposite surfaces of one insulation layer, and a solder resist may be applied to surfaces of the circuit pattern and the insulation layer to form a printed circuit pattern.

It is impossible to bend the printed circuit board having an insulation layer formed of a synthetic resin. The reason is because the circuit pattern or the insulation layer cannot be bent by approximately 90 degrees, and if the insulation layer is bent by the degree, it is susceptible to being broken.

Further, when a printed circuit board is installed and used in a narrow space in the housing, lots of heat is generated in the printed circuit board. If the generated heat is not more effectively dispersed to the entire printed circuit board, heat emission is concentrated at a specific location, so the printed circuit board may be damaged by heat at the specific location or components installed at the location may be damaged by heat.

DISCLOSURE

Technical Problem

Therefore, embodiments of the present invention have been made in view of the above-mentioned problems, and an aspect of the present invention is to simplify a circuit pattern of a printed circuit board used in a board block.

It is another aspect of the present invention to bend a metal layer of a printed circuit board such that the metal layer is exposed to the outside, thereby forming the printed circuit board in various shapes.

It is still another aspect of the present invention to provide one printed circuit board which can be installed on inner surfaces of a housing forming a predetermined angle in a space to have predetermined apertures therebetween.

It is yet another aspect of the present invention to prevent corrosion of a portion of a metal layer exposed to the outside for bending of a printed circuit board.

Technical Solution

In accordance with an aspect of the present invention, there is provided a printed circuit board including: a first area having an insulation layer formed on a surface of a metal layer formed of a metal and a first circuit pattern formed in the insulation layer; a second area provided separately from the first area and having a separate insulation layer formed on a surface of the metal layer and a second circuit pattern formed in the separate insulation layer; and an exposure area formed between the first area and the second area and from which the metal layer is exposed.

In accordance with another aspect of the present invention, there is provided a printed circuit board including: a metal layer formed of a metal; and an insulation layer and a circuit pattern layer formed on a surface of the metal layer, wherein the insulation layer and the circuit pattern layer are divided into a first area and a second area with respect to an exposure area from which the metal layer is exposed, wherein a component coupling terminal for coupling a fuse is installed on one surface of the first area, a first connector terminal constituting a first connector unit is installed on an opposite surface of the first area, and a first circuit pattern for supplying electric power transferred through the metal layer to the first connector terminal via the fuse is provided, and wherein a microchip is mounted to one surface of the second area to control electric power transferred through the metal layer, and a second circuit pattern for supplying a control signal output from the microchip to a second connector terminal provided in the second area is provided.

In accordance with still another aspect of the present invention, there is provided a printed circuit board having a metal layer formed of a metal material, insulation layers formed on opposite surfaces of the metal layer, and circuit patterns formed on the insulation layers, the printed circuit board including: an exposure area from which opposite peripheries of the metal layer and a surface between the peripheries are exposed to the outside; a first area connected to one side of the exposure area via the metal layer, the insulation layers and the circuit patterns being formed on the opposite surfaces of the metal layer; and a second area connected to an opposite side of the exposure area via the metal layer, the insulation layers and the circuit patterns being formed on the opposite surfaces of the metal layer, wherein the metal layer of the exposure area is bent such that imaginary extension planes of the first area and the second area form a predetermined angle.

In accordance with yet another aspect of the present invention, there is provided a board block for vehicles, including: a housing having an interior space; a first printed circuit board installed within the housing and having a first area and a second area divided by an exposure area from which a metal layer is exposed such that surfaces of the first and second areas face an inner surface of the housing, wherein a circuit pattern is formed on an insulation layer of the metal layer; a first connector unit installed in the first area of the first printed circuit board and a tip end of which faces a lower side of the housing; and a second connector unit installed in the second area of the first printed circuit board and a tip end of which faces the lower side of the housing.

Advantageous Effects

The printed circuit board of the board block for vehicles according to the present invention has the following effects.

First, in the printed circuit board according to the present invention, since a metal layer replaces a high current circuit pattern and a circuit pattern for supplying electric power to a fuse and a circuit pattern for a control signal are separately disposed, the circuit patterns can be very simply designed one the whole, the printed circuit board can be designed easily, and the size of the printed circuit board can be minimized.

In the printed circuit board according to the present invention, in particular, since a first area for supplying electric power through a fuse and a second area for transmission of a control signal are formed perpendicular to each other, a terminal for coupling to a fuse is installed on one surface of the first area, and a first connector unit is disposed on an opposite surface of the first area, the length of a circuit pattern extending from the first area to the first connector unit via the fuse can be shortened and a voltage drop in the circuit pattern can be reduced.

Further, in the present invention, a first connector unit provided in the first area of the printed circuit board and a second connector unit provided in the second area can be stepped side by side such that tip ends of the first connector unit and the second connector unit faces a lower side of the housing, the board block is installed in a general box, making it possible to increase the utility of the board block.

In addition, in the printed circuit board of the present invention, since a metal layer is provided in the interior or on an outer surface of the printed circuit board, heat can be more uniformly spread in the printed circuit board, making it possible to prevent heat from being concentrated at a specific portion of the printed circuit board and increasing the durability of the printed circuit board.

Next, in the present invention, since an exposure area from which the metal layer located between the first area and the second area is exposed can be bent at a desired angle, an angle between the first area and the second area can be variously formed so that the printed circuit board can be located on an inner surface of a housing having various shapes, making it possible to make an outer appearance of a product various and minimize the product.

Furthermore, in the present invention, since the first area and the second area are included in one printed circuit board to meet each other at a predetermined angle so that they face in different directions, a separate electrical connection is not provided therebetween. Thus, for example, printed circuit boards having been used as two parts can be made one, making it possible to eliminate an electrical connection between the printed circuit boards and simplify the product.

Moreover, in the present invention, since a shield film is attached to a surface of the exposure area corresponding to the metal layer exposed to the outside and a moisture-proof agent is applied to the surface of the exposure area, the metal layer exposed to the outside of the printed circuit board can be prevented from being corroded by an external environment, making it possible to increase the durability of the printed circuit board using the metal layer. In particular, since the shield film having a small thickness is attached to the exposure area or the moisture-proof agent is applied to the exposure area, the overall size of the printed circuit board can be reduced.

BRIEF DESCRIPTION OF THE DRAWINGS

The foregoing and other objects, features and advantages of the present invention will become more apparent from the following detailed description when taken in conjunction with the accompanying drawings in which.

BEST MODE

Mode for Invention

Figure 1:
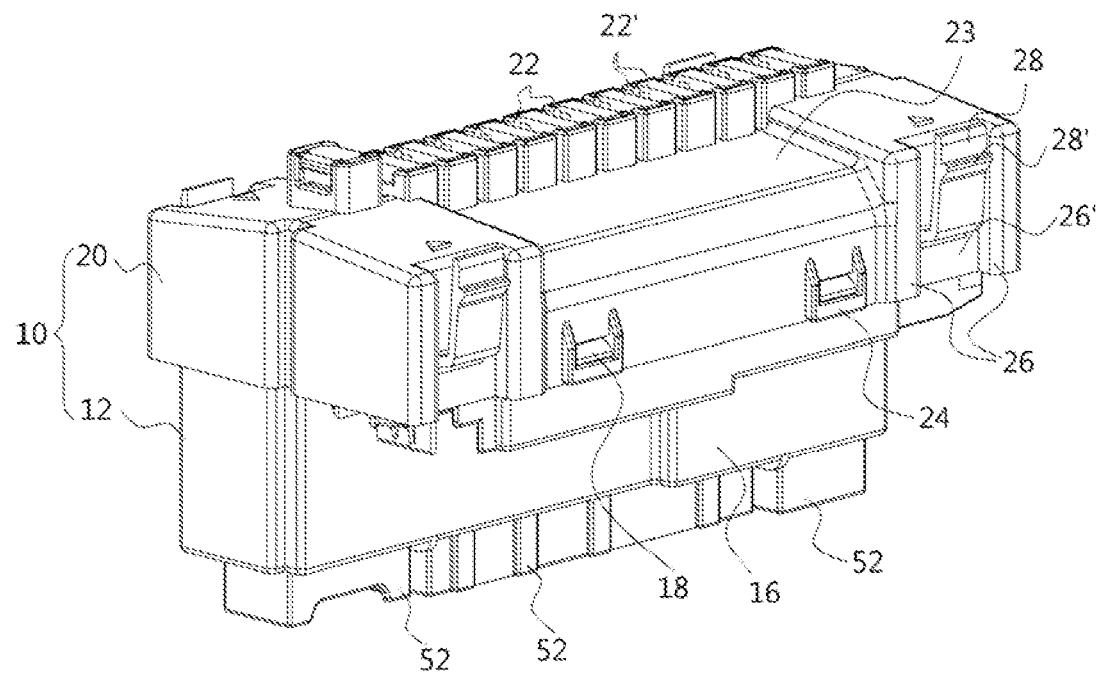
FIG. 1 is a perspective view showing a board block for vehicles according to an embodiment of the present invention.
Figure 2:
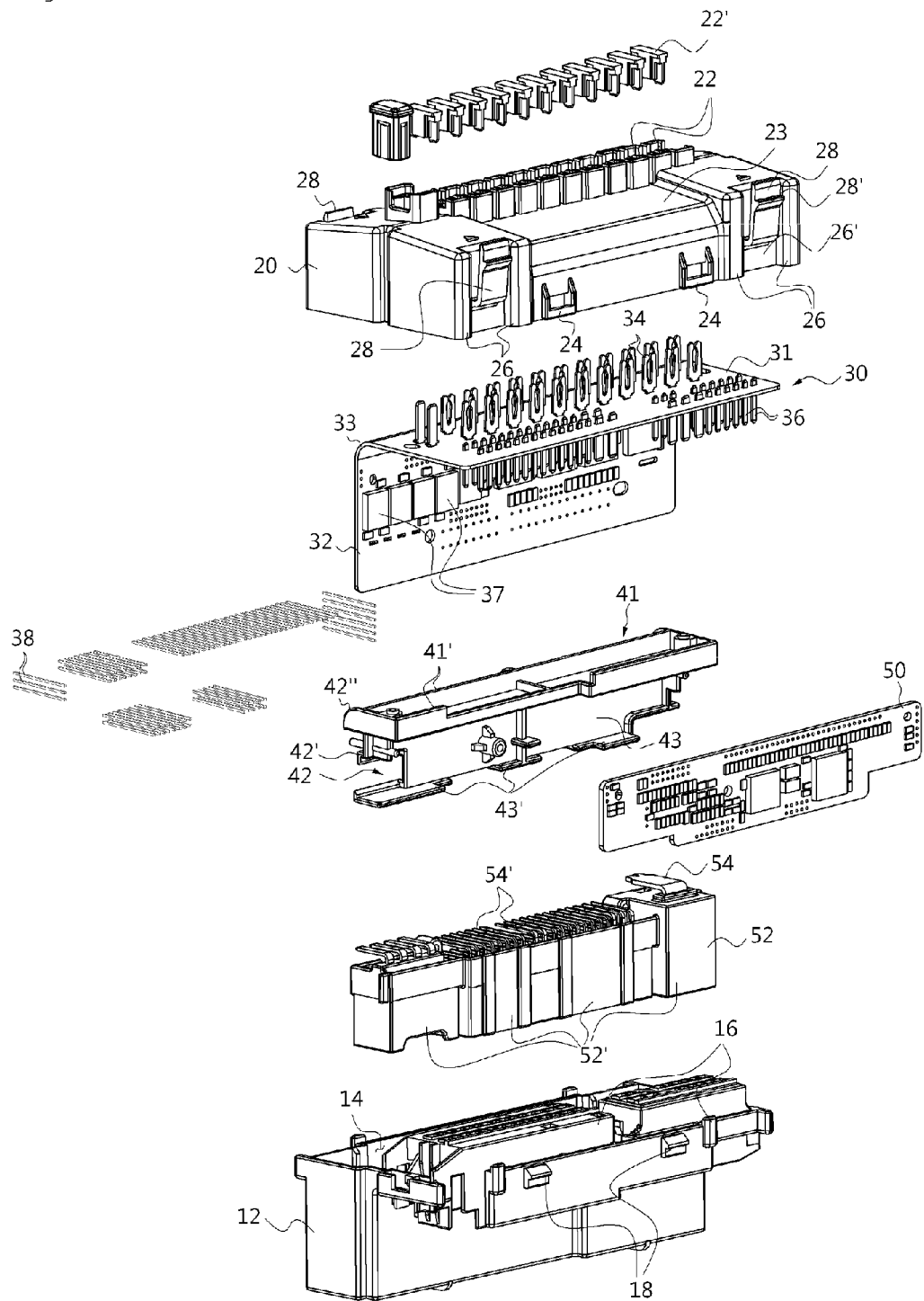
FIG. 2 is an exploded perspective view showing the board block according to the embodiment of the present invention.

Hereinafter, a printed circuit board according to the present invention and a board block for vehicles using the same will be described in detail with reference to the accompanying drawings.

As shown in FIGS. 1 to 4, a housing 10 forms an outer appearance and a frame of a board block. The housing 10 includes a housing body 12 and a housing cover 20. The housing 10 may further include other components in addition to the housing body 12 and the housing cover 20. However, the housing 10 includes at least the housing body 12 and the housing cover 20.

The housing body 12 has an interior space 14 having an open-topped hexahedral shape therein. A second area 32 of a first printed circuit board 30, which will be described below, and a second printed circuit board 50 are located in the interior space 14.

A first connector unit 16 is integrally formed at one side of the housing body 12. The first connector unit 16 is provided at one side of an upper end of the housing body 12, and an entrance of the first connector unit 16 is opened in a direction in which the interior space 14 is opened toward the lower side of the housing body 12.

Coupling bosses 18 for coupling the housing 10 to the housing cover 20 protrude from an outer surface of an upper end of the housing body 12 and an outer surface of the first connector unit 16. A total of four coupling bosses 18 are formed in the embodiment of the present invention.

The housing cover 20 is installed so as to cover almost all portions of the upper end of the housing body 12 and a rear end of the first connector unit 16. An interior of the housing cover 20 is opened downward, and a first area 31 of the first printed circuit board 30, which will be described below, is located in the interior of the housing cover 20.

A plurality of component installation units 22 are arranged in a row on the upper surface of the housing cover 20 in a lengthwise direction of the housing cover 20. In the embodiment, fuses 22' are inserted into and installed in the component installation units 22. The component installation units 22 protrude with respect to the upper surface of the housing cover 20, and inclined surfaces 23 are formed on the upper surface of the housing cover 20 adjacent to the component installation units 22. The inclined surfaces 23 start from the component installation units 22 and are inclined downward as they go toward opposite widthwise ends of the housing cover 20. In this way, as the inclined surfaces 23 are inclined downward as they go to the opposite widthwise ends of the housing cover 20, an operator can easily hold opposite side surfaces of the component installation units 22. Thus, the operator can hold the component installation units 22 with their hands to separate the housing cover 20 from the housing body 12.

Coupling stoppers 24 stopped by the coupling bosses 18 of the housing body 12 to couple the housing cover 20 and the housing body 12 are formed on opposite widthwise outer surfaces of the housing cover 20. In the embodiment of the present invention, the coupling stoppers 24 protrude from the opposite outer surfaces of the housing cover 20 and have a substantially U-shaped cross-section. However, the structure is not inevitably necessary, and the coupling stoppers may pass through opposite side surfaces of the housing cover 20 in the form of holes.

A pair of space bosses 26 are formed longwise from an upper side to a lower side of the housing cover 20 on each of opposite side surfaces of a front and rear lengthwise ends of the housing cover 20. The spacer bosses 26 protrude furthest from the outer surface of the housing cover 20 as compared with the other parts of the housing cover 20. When the board block is mounted to the box, the spacer bosses 26 are attached to the inner surface of the interior space of the box. The housing cover 20 is prevented from moving as the surfaces of the spacer bosses 26 are attached to the interior space of the box.

Recesses 26' are defined between the spacer bosses 26 to be recessed with respect to the spacer bosses 26. The recesses 26' are recessed between the spacer bosses 26, and mounting hooks 28 are provided in the interiors of the recesses 26'. The mounting hooks 28 extend longwise along the inner surfaces of the recesses 26', and ends of the mounting hooks 28 are connected to inner surfaces of the housing cover 20 corresponding to the recesses 26' to be resiliently deformed. A stopping step 28' is formed in each of the mounting hooks 28. The stopping step 28' protrudes from one surface of a tip end of the mounting hook 28 and is stopped by the inner surface of the interior space of the box to mount the board block to the box. It is preferable that a tip end of the mounting hook 28 protrudes slightly further than the upper surface of the housing cover 20.

The first printed circuit board 30 is installed within the housing 10. The first printed circuit board 30 has a metal layer 30' therein. The metal layer 30' is a metal plate, for example, a copper plate. The metal layer 30' forms a frame in the first printed circuit board 30, and serves as a kind of circuit pattern for the power supply. Insulation layers and circuit pattern layers are sequentially stacked on opposite surfaces of the metal layer 30' of the first printed circuit board 30. Of course, one surface of the metal layer 30' may be one surface of the first printed circuit board 30.

The first printed circuit board 30 has a first area 31 facing an inner ceiling of the housing cover 20 and a second area 32 facing an inner surface of the housing body 12. An exposure area 33 is provided between the first area 31 and the second area 32. The exposure area 33 is an area where the insulation layer and the circuit pattern layer are not formed in either of opposite surfaces thereof and the metal layer 30' is exposed to the outside. That is, the exposure area 33 is a portion formed only of the metal layer 30', so the exposure area 33 may be bent at a desired angle. In the embodiment of the present invention, the exposure area 33 is bent to have a predetermined radius of curvature, and imaginary extension planes of the first area 31 and the second area 32 are perpendicular to each other.

Component coupling terminals 34 electrically connected to legs of fuses 22', respectively, are installed at a location of the first area 31 corresponding to the component mounting unit 22. The component coupling terminals 34 extend toward the ceiling of the housing cover 20.

First connector terminals 36 are installed on a surface of the first area 31 opposite to the component coupling terminals 34. The first connector terminals 36 extend in a direction opposite to the component coupling terminals 34, and are located within the first connection unit 16 to be electrically connected to terminals of counterpart connectors coupled to the first connection unit 16. A first circuit pattern 31' is provided in the first area 31 to electrically connect the metal layer 30' to the component coupling terminals 34, and the component coupling terminals 34 to the first connector terminals 36.

Meanwhile, a plurality of microchips 37 are mounted to the second area 32. The microchips 37 serve, for example, as relays. The microchips 37 allow the second area 32 to process control signals. The microchips 37 and the metal layer 30' are electrically connected to each other by a second circuit pattern 32'. The microchips 37 are electrically connected to second connector terminals 54' of a second connector unit 52', which will be described below, by the second circuit pattern 32'.

A plurality of jumper pins 38 are provided in the second area 32. The jumper pins 38 are adapted to electrically connect a second printed circuit board 50, which will be described below, and the first printed circuit board 30. Ends of the jumper pins 38 are connected to the second area 32 of a second circuit pattern 32', and opposite ends of the jumper pins 38 are connected to the second printed circuit board 50.

A center board 40 is located between the second area of the first printed circuit board 30 and the second printed circuit board 50, which will be described below, and the second area 32 and the second printed circuit board 50 are coupled to each other at a predetermined interval.

The center board 40 is made of a synthetic resin, and a first area mounting unit 41 in which the first area 31 of the first printed circuit board 30 is positioned to be coupled is provided in the center board 40. Mounting pieces 41' are provided along a periphery of the first area mounting unit 41. The mounting pieces 41' have thin plate shapes. The mounting pieces 41' are formed along almost the entire periphery of the first area mounting unit 41 in the embodiment, but the present invention is not limited thereto.

A second area mounting unit 42 is provided to be perpendicular to the first area mounting unit 41. The second area 32 of the first printed circuit board 30 is mounted to the second area mounting unit 42. Mounting pieces 42' are also provided in the form of thin plates along a periphery of the second area mounting unit 42. Mounting pieces 42' are also formed along the entire second area mounting unit 42. Of course, the mounting pieces 42' may be formed intermittently.

Meanwhile, an exposure area positioning piece 42" extends from the first area mounting unit 41. An exposure area 33 of the first printed circuit board 30 is positioned on the exposure area positioning piece 42". Thus, a curved surface having the same radius of curvature as that of the exposure area 33 is formed in the exposure area positioning piece 42".

An opposite surface of the second area mounting unit 42 corresponds to a second printed circuit board mounting unit 43. The second printed circuit board 50, which will be described below, is mounted to the second printed circuit board mounting unit 43. Mounting pieces 43' are also formed along a periphery of the second printed circuit board mounting unit 43. The mounting pieces 43' may also be formed along all the periphery of the second printed circuit board mounting unit 43 or intermittently. Of course, it is more preferable to form the the mounting pieces 43' intermittently than to form the mounting pieces 43' along all the periphery of the second printed circuit board mounting unit 43 for smooth air flow.

The mounting pieces 41', 42', and 43' formed in the mounting units 41, 42, and 43 of the center board 40 has thin plate shapes, respectively, and since areas of the first, second, and third mounting pieces 41', 42', and 43' of the mounting units 41, 42, and 43 contacting the printed circuit boards 30 and 50 can be reduced by the thin plate shapes, it is advantageous in the aspect of utilization of surfaces of the printed circuit boards 30 and 50 or in the aspect of heat dissipation.

The second printed circuit board 50 is mounted to the second printed circuit board mounting unit 43 of the center board 40. The second printed circuit board 50 has a square plate shape, and many components are mounted to the second printed circuit board 50. The second printed circuit board is mainly for control, and various chips, which are components for control, are mounted to the second printed circuit board 50. For reference, the first printed circuit board 30 mainly performs a function of controlling the power supply and performs a function of signal processing.

Meanwhile, an input connector unit 52 and a second connector unit 52' are provided such that tip ends thereof are opened to a lower side of the interior space 14 of the housing body 12. The input connector unit 52 is connected to a power source of a battery or a power generator, and serves to supply electric power to the first printed circuit board 30. The second connector unit 52' serves to transfer a control signal generated by a microchip 37 of the second area 32 from the first printed circuit board 30 to the outside. The input connector unit 52 and the second connector unit 52' are provided on a surface of the second area 32 which can be viewed from a surface of the first area 31 to which the first connector terminal 36 is mounted. Of course, when more second connector units 52' are necessary, the second connector unit 52' may be installed even on a surface opposite to the surface on which the second connector unit 52' is installed.

The input connector unit 52 and the second connector unit 52' are installed in the second area 32 of the first printed circuit 30, and the tip ends thereof are exposed to a lower side of the interior space 14 of the housing body 12 while the first printed circuit board 30 is installed. Thus, when the housing body 12 is viewed from the lower side, the input connector unit 52 and the second connector unit 52' protrude further and the first connector unit 16 is retreated relatively. That is, the first connector terminal 36 of the first connector unit 16 is installed in the first area 31 of the first printed circuit board 30. Accordingly, a length of a first circuit pattern 31' of the first area 31 related to the first connector terminal 36 becomes relatively short. Reference numerals 54 and 54' denote an input connector terminal 54 and a second connector terminal 54' provided in the input connector unit and the second connector unit 52', respectively. The input connector terminal 54 is electrically connected to the metal layer 30'.

Figure 5:
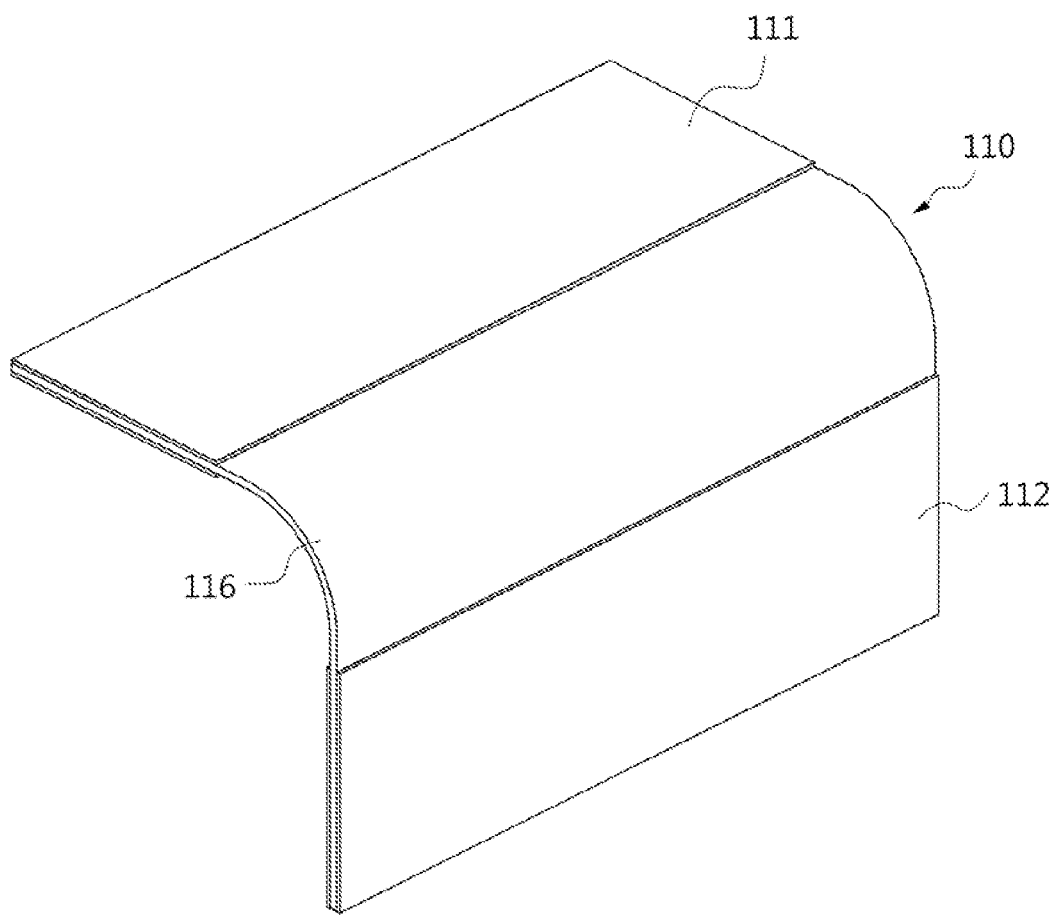
FIG. 5 is a perspective view showing a printed circuit board according to another embodiment of the present invention.

Meanwhile, FIG. 5 shows a printed circuit board 110 according to another embodiment of the present invention. The printed circuit board 110 of the present embodiment also includes a first area 111, a second area 112, and an exposure area 114 provided between the first area 111 and the second area 112. Of course, the first area 111, the second area 112, and the exposure area 114 may be provided at a plurality of locations. The first area 111 and the second area 112 have an insulation layer 118, a circuit pattern 120, and a solder resist 124 therein, respectively. The exposure area 114 has only a metal layer 116 formed of a metal. The metal layer 116 constituting the exposure area 114 is integrally formed with those provided in the first and second area 111 and 112. The metal layer 116 is a metal plate, and for example, a plate made of copper. A plurality of through portions 117 are formed in the metal layer 116. The through portions 117 pass through the metal layer 116 in a predetermined shape, and a through-hole 122, which will be described below, may be formed in the through portions 117.

Meanwhile, all of opposite peripheries of the metal layer 116 and portions therebetween are exposed in the exposure area 114. The exposure area 114 can be bent only when all of the opposite peripheries of the metal layer 116 and portions therebetween are exposed in the exposure area 114. That is, if only one periphery of the metal layer 116 constituting the exposure area 114 and a surface extending therefrom are exposed, it is impossible to bend the exposure area 114. It is preferable that the imaginary line connecting the opposite peripheries of the exposure area 114 is linear. The reason is because the exposure area 114 can be bent.

The internal configurations of the first area 111 and the second area 112 will be described with reference to FIG. 6. The frame of the printed circuit board 110 is formed by the metal layer 116, and the insulation layer 118 is formed on a surface of the metal layer 116. The insulation layer 118 is formed of an electrically insulating material. The material forming the insulation layer 118 is one generally used when the printed circuit board 110 is manufactured, and a detailed description thereof will not be described.

A circuit pattern 120 is formed on a surface of the insulation layer 118. The circuit pattern 120 is formed by selectively removing a copper foil and performing a plating process. The plating is generally performed at the remaining copper foil portions and the through-hole 122 portions, which will be described below. A portion of the circuit pattern 120 is exposed to the outside, and the remaining portions are not exposed to the outside. The circuit pattern 120 exposed to the outside is a part to which, for example, a lead 132 of the component 130 is mounted.

The circuit patterns 120 on opposite surfaces of the printed circuit board 110 may be electrically connected to each other. That is, the through-hole 122 passes through the insulation layer 118, and if the plating layer is formed on the inner surface of the through-hole 122 to be electrically connected to the circuit patterns 120 formed on the opposite surfaces of the printed circuit board 110, the circuit patterns 120 on the opposite surface of the printed circuit board are electrically connected to each other. Since the through-hole 122 for connecting the circuit patterns 120 should not be electrically connected to the metal layer 116, it passes through the insulation layer 118 provided in the through portions 117 formed in the metal layer 116.

Meanwhile, in addition to the through-hole 122, there is a through-hole 122' passing through the metal layer 116 and the insulation layer 118. A plating layer is also formed on an inner surface of the through-hole 122' to be electrically and thermally connected to the metal layer 116. The plating layer formed in the through-hole 122' may be electrically connected to the metal layer 116 to serve, for example, as a ground. Of course, the plating layer may serve as an electrical connector for transfer of signals. The plating layer formed in the through-hole 122' is also integrally connected to the metal layer 116 to serve to transfer heat to the metal layer 116.

A solder resist 124 is applied to a surface of the printed circuit board 110. The solder resist 124 is applied to cover the surface of the insulation layer 118 and the circuit pattern 120. The solder resist 124 serves to protect the insulation layer 118 and the circuit pattern 120, and allows soldering to be performed only at a specific portion at the same time.

Meanwhile, the exposure area 114 is exposed to the outside of the metal layer 116. Since the exposure area 114 may be influenced by an external environment, it may be shielded from the external environment by using shield films 126. The shield films 126 are attached to opposite surfaces of the exposure area 114. The thicknesses of the shield films 126 are so that the surfaces of the first and second areas 111 and 112 are not thicker than the thickness (including the shield film 126) of the exposure area 114.

A moisture-proof agent may be applied to a surface of the exposure area 114 instead of the shield film 126. The moisture-proof agent is applied to the surface of the exposure area 114 to serve as a corrosion preventing agent for preventing the metal layer 116 exposed from the exposure area 114 from being corroded.

A component 130 may be mounted to the first and second areas 111 and 112 of the printed circuit board 110. The component 130 may be, for example, a semiconductor package for performing a specific function. The component 130 is electrically connected to the circuit pattern 120 exposed to the outside of the solder resist 124 by soldering a lead 132 protruding from an outer surface thereof to the circuit pattern 120. The component 130 is attached to the plating layer of the through-hole 122' to transfer heat to the metal layer 116. The component 130 may be grounded through the plating layer of the through-hole 122'.

Terminals (not shown) may also be installed in the areas 111 and 112 of the printed circuit board 110. The terminals may be electrically connected to a component such as a fuse or may constitute a connector connected to terminals of an outside terminal.

Meanwhile, in the printed circuit board 110 shown in FIG. 5, the first area 111 and the second area 112 are connected with respect to the exposure area 114 and imaginary extension planes thereof are perpendicular to each other such that the sizes and surface areas of the first area 111 and the second area 112 are substantially the same. However, the sizes and surface areas the first area 111 and the second area 112, and an angle therebetween may be variously determined.

Figure 7:
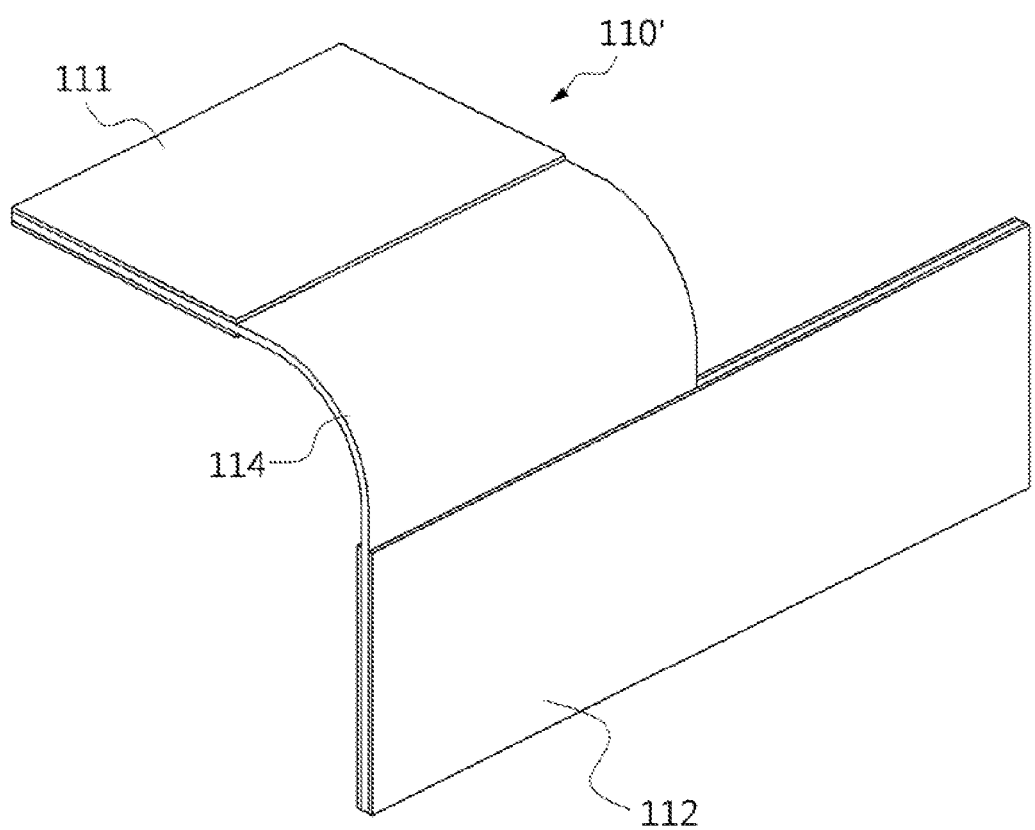
FIG. 7 is a perspective view showing a printed circuit board according to another embodiment of the present invention.

First, the areas and sizes of the first area 111 and the second area 112 may be different as shown in FIG. 7. Referring to FIG. 7, the size and surface area of the first area 111 are larger than those of the second area 112. That is, the size of the first area 111 is substantially half that of the second area 112.

Figure 8:
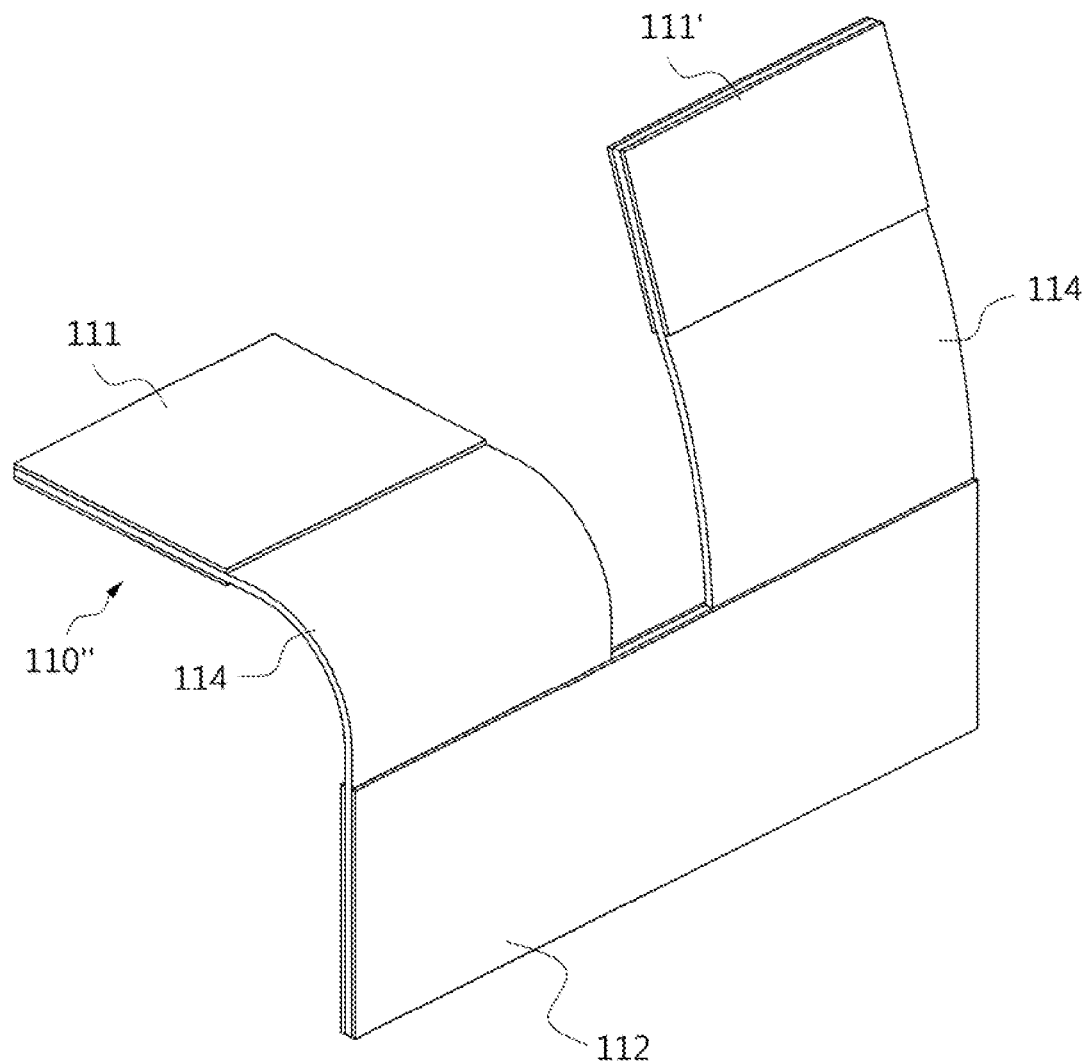
FIG. 8 is a perspective view showing a printed circuit board according to another embodiment of the present invention.

FIG. 8 shows that the first area 111 and 111' are divided into two parts and one part of the first areas is bent at a different angle with respect to the second area 112. That is, the imaginary extension plane of the first area 111 is perpendicular to that of the second area 112, the other part of the first area 111' has an imaginary extension plate forming a predetermined angle with the second area 112.

Figure 9:
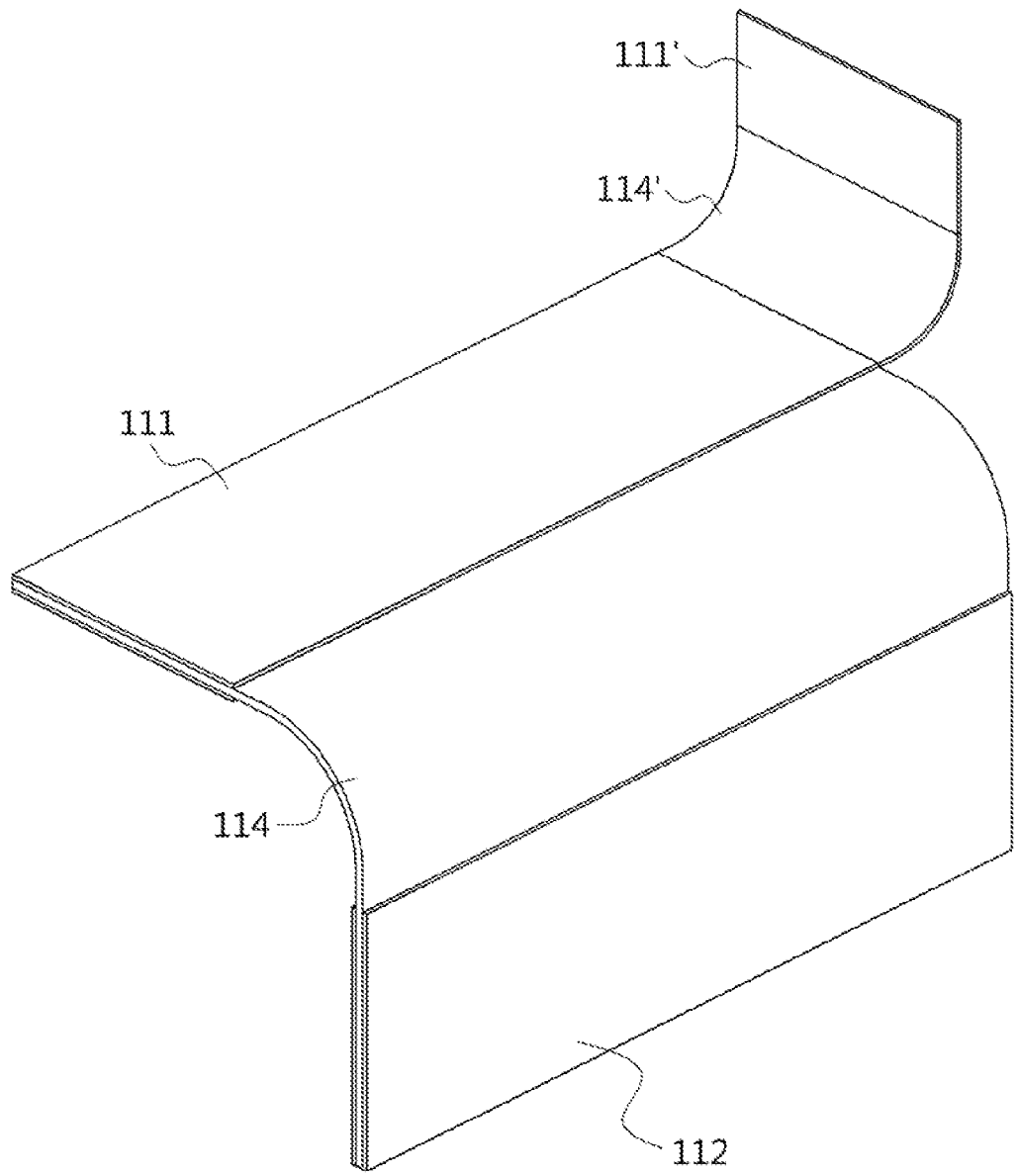
FIG. 9 is a perspective view showing a printed circuit board according to another embodiment of the present invention.

FIG. 9 shows that another exposure area 114' is formed at a side periphery of the first area 111 in addition to the periphery of the first area 111 connected to the exposure area 114 to form the other first area 111'. Since more areas and exposure areas are provided in various forms in addition to the first area 111, the second area 112, and the exposure area 114, the printed circuit board 10 may be bent.

Meanwhile, although not shown in the drawings, an angle by which the exposure area 114 is bent may be variously determined. The reason is because the printed circuit board 110 can be variously designed according to the shape of the housing of a product to which the printed circuit board 110 is applied.

Figure 10:
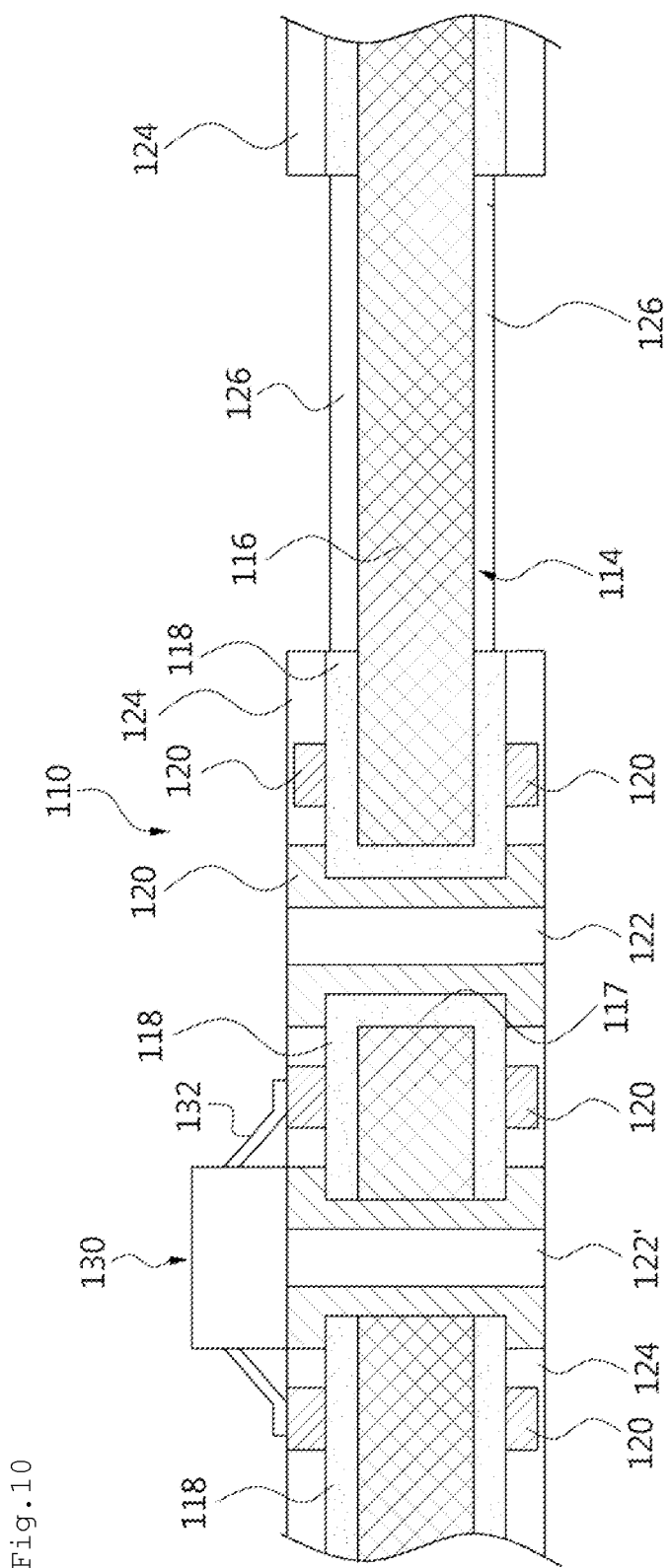
FIG. 10 is a sectional view showing an internal configuration of a printed circuit board according to another embodiment of the present invention.
Figure 11:
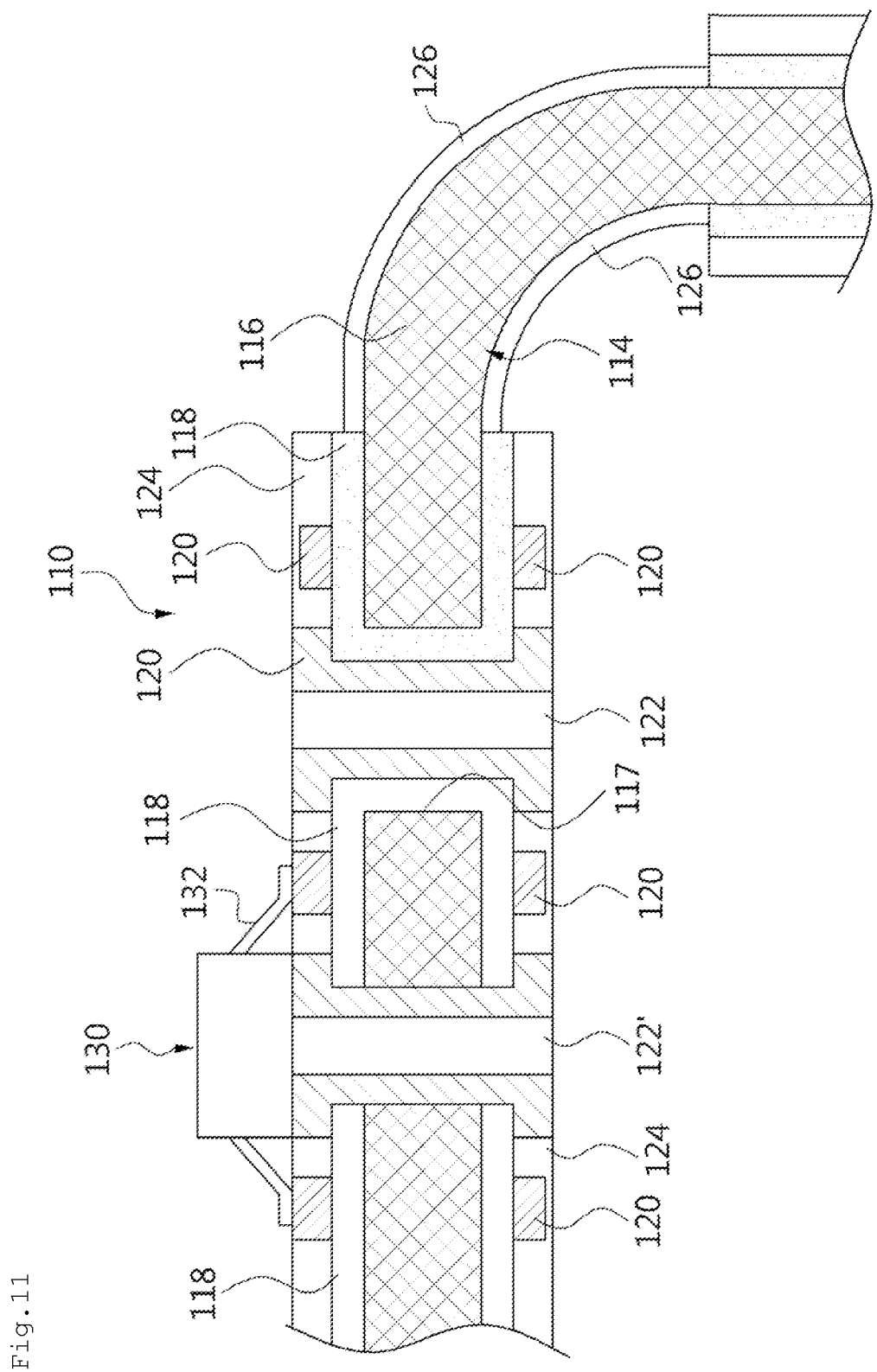
FIG. 11 shows that the printed circuit board of FIG. 10 is bent at an exposed portion.

FIGS. 10 and 11 show another embodiment of the present invention, which is similar to those embodiments described above, and thus the same reference numeral are given and only important parts will be described.

In the present embodiment, polyimide (PI) films are used as the shield films 126 attached to the exposure area 114. The polyimide films have such an excellent heat resisting property that they can endure a high temperature of 400° C. or a low temperature of −269° C. and are very deflectable. The polyimide films are attached to opposite surfaces of the exposure area 114. The polyimide films are so thin that the thickness of the exposure area 114 to which the polyimide films are attached is not larger than those of the first and second areas 111 and 112.

Considering that the exposure area 114 is bent, the polyimide films may have a relatively large thickness at a portion corresponding to an outer surface of the exposure area 114 when the exposure area 114 is bent, and have a relatively small thickness at a portion corresponding to an inner surface of the exposure area 114. This structure is well shown in FIG. 10.

Hereinafter, the printed circuit board and the board block for vehicles using the same according to the present invention will be described in detail.

Figure 3:
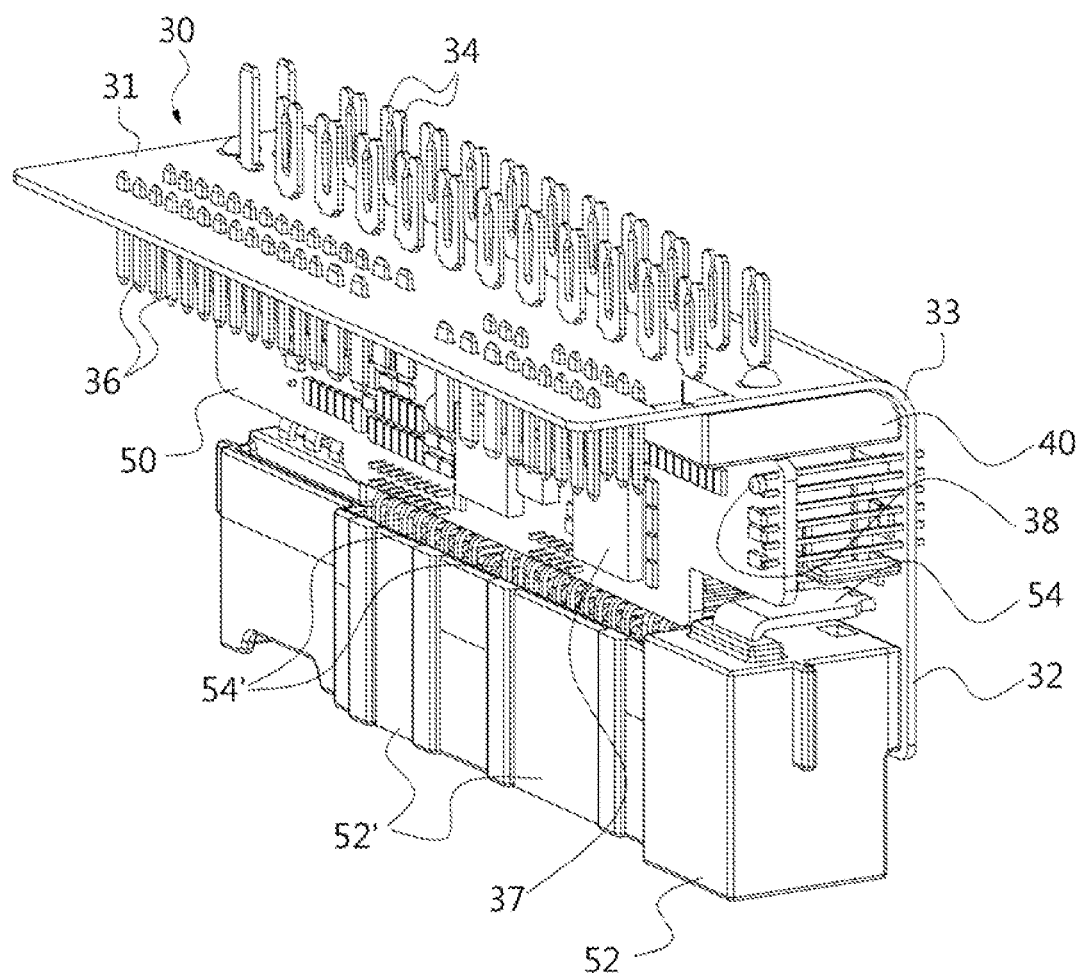
FIG. 3 is a perspective view showing one assembly including a first printed circuit board, a second printed circuit board, a center board, and a second connector unit according to the embodiment of the present invention.
Figure 4:
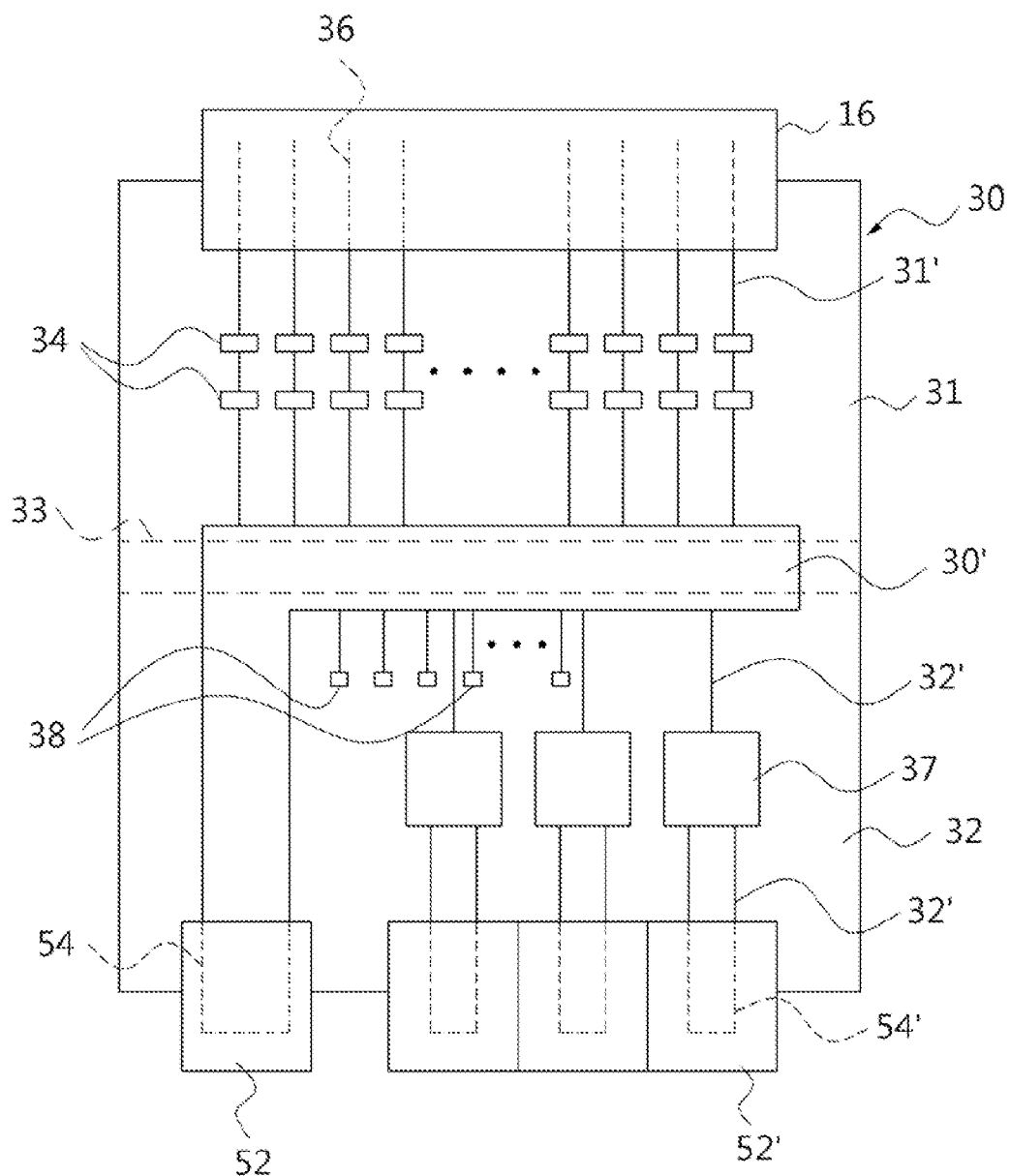
FIG. 4 is a view schematically showing a circuit pattern of a printed circuit board according to the embodiment of the present invention.

As well shown in FIG. 3, the first printed circuit board 30, the center board 40, the second printed circuit board 50, and the second connector terminal 54 constituting the board block of the present invention may form an assembly to be supplied to an assembly line. That is, after the first printed circuit board 30 or the second printed circuit board 50 are mounted to the center board 40 and ends of the jumper pins 38 are coupled to the first printed circuit board 30 and the second printed circuit board 50, the second printed circuit board 50 or the first printed circuit board 30 is coupled to the center board 40. While the first and second printed circuit boards 30 and 50 are preliminarily assembled in the structure formed in the center board 40, they are coupled to the center board 40 by using screws.

The input connector unit 52 and the second connector unit 52' are mounted to the second area 32 of the first printed circuit board 30. For reference, the second connector unit 52' is divided into a plurality of areas as if a plurality of connectors are integrally formed.

The assembly portion is well shown in FIG. 3, in which the second area 32, the center board 40, and the second printed circuit board 30 are inserted into the interior space 14 of the housing body 12. Then, the first connector terminal 36 in the first area 31 is inserted into and positioned in the first connector unit 16 of the housing body 12.

The first area 31 of the first printed circuit board is shielded by coupling the housing cover 20 to the housing body 12. The housing cover 20 is coupled to the housing body 12 by stopping the coupling bosses 18 with the coupling stoppers 24.

If the housing body 12 and the housing cover 20 are coupled to each other, the component coupling terminals 34 are located within the component mounting unit 22 of the housing cover 20. Thus, if the fuses 22' are mounted to the component mounting unit 22, the legs of the fuses 22' are coupled to the component coupling terminals 34.

If the housing body 12 and the housing cover 20 are coupled to each other, the board block is finished as shown in FIG. 1. Next, the fuses 22' are inserted into and mounted to the component mounting unit 22 of the housing cover 20, and corresponding connectors (not shown) are coupled to the first connector unit 16, the input connector unit 52, and the second connector unit 52'.

The board block of the present invention is generally mounted to and used in the mounting space of the box. Of course, the board block may be used individually. In this case, corresponding connectors may be coupled to the first connector unit 16, the input connector unit 52, and the second connector unit 52' as described above. When the board block is mounted to and used in the box, the connectors may be coupled after the box is mounted.

When the board block is mounted to the mounting space of the box, the spacer bosses 26 formed on an outer surface of the housing 10 are attached to the inner surface of the mounting space. Further, the mounting hooks 28 between the spacer bosses 26 are stopped by the stopping structure in the mounting space of the box such that the board block is mounted to the box. The mounting hooks 28 are guided by the stopping structure in the mounting space of the box to be resiliently deformed, and are restored to the original shape such that the stopping step 28' is stopped by the stopping structure after the stopping step 28' passes through the stopping structure.

A process of separating the board block from the mounting space of the box is as follows.

First, the mounting hooks 28 are resiliently deformed and attached to the inner surface of the recess 26' such that the stopping step 28' is separated from the stopping structure and is raised slightly. While the mounting hooks 28 are resiliently deformed and the stopping step 28' is separated from the stopping structure in this way, the component mounting unit 22 of the housing cover 20 may be held by fingers.

Since the inclined surfaces 23 are formed on the upper surface of the housing cover 20 corresponding to the periphery of the component mounting unit 22, the component mounting unit 22 protrudes further so that an operator can easily hold the component mounting unit 22 with his or her fingers.

Meanwhile, heat may be generated in the first printed circuit board 30 and the second printed circuit board 50 during operations thereof, in which case since the first printed circuit board 30 and the second printed circuit board 50 are installed to have a predetermined interval by the center board 40, heat may be generated more easily. In particular, since the first printed circuit board 30 has the metal layer 30' therein, heat generated at a specific location of the printed circuit board 30 can be uniformly spread to the entire metal layer 30', making it possible to maintain an average temperature of the printed circuit board 30 at a lower temperature.

Further, since the mounting pieces 41', 42', and 43' of the center board 40 have thin plate shapes and are intermittently formed along the peripheries of the mounting units 41, 42, and 43, areas of the printed circuit boards 30 and 50 contacting the center board 40 can be reduced, making it possible to discharge the heat generated by the printed circuit boards 30 and 50 better.

Meanwhile, electric power is supplied to the first printed circuit board 30 through the input connector unit in the present invention. The electric power is transferred to the metal layer 30', and is supplied to the component coupling terminals 34 through the first circuit pattern 31' in the first area 31. Thus, the electric power is transferred to a load through the first circuit pattern 31', the component coupling terminals 34, the fuses 22', the first circuit pattern 31', and the first connector unit 16 in the first area 31.

Electric power is supplied to the microchip 37 and the second connector unit 52' through the second circuit pattern 32' in the second area 32 to be controlled by the microchip 37, and a signal is transferred to the second connector unit 52' through the second circuit pattern 32' to be sent to the outside. Further, signals may be exchanged between the first printed circuit board 30 and the second printed circuit board 50 through the jumper pins 38, and an on signal may be transferred to the outside through the second connector unit 52' in the second printed circuit board 50.

For reference, since the first area 31 and the second area 32 of the first printed circuit 30 of the present invention are perpendicular to each other and the first connector unit 16 is provided on a surface of the first area 31 facing the housing cover 20, the tip end of the first connector unit 16 may face in the same direction as that of the second connector unit 52' provided in the second area 32. Thus, the electric power transferred through the input connector unit 52 of the second area 32 is not transferred to the second area 32 again once it is transferred to the first area 31 and the metal layer 30', and can be transferred to the outside through the first connector 16 in the first area 31.

The electric power transferred through the metal layer 30' is controlled by the microchip 37 in the second area 32, and a control signal is transferred to the outside through the second connector 52' in the second area 32.

Thus, since the circuit patterns 31' and 32' formed in the first printed circuit board 30 are located only in the areas, respectively, it is very simple to design the circuit patterns 31' and 32'. That is, the circuit patterns 31' and 32' are not complicated so as to be designed very simply.

Meanwhile, in the printed circuit board 110, the imaginary extension surfaces of the first area 111 and the second area 112 are perpendicular to each other. If the printed circuit board 110 is configured in this way, the inner surface of the housing also is perpendicular to the first area 111 and the second area 112 when the first area 111 and the second area 112 are disposed adjacent to the inner surface of the housing of a produce to which the printed circuit board 110 is applied.

Further, since a bent angle of the exposure area 114 can be freely formed by an operator, a degree of freedom in design of the housing can increase. That is, although the inner surface of the housing has various forms, it will operate if a bent angle of the exposure area 114 is matched with the angle between the inner surfaces of the housing while one printed circuit board 110 is used. For reference, although the exposure area 114 is present only between the first area 111 and the second area 112 in the embodiment, for example, another exposure area at a periphery of an end of the second area 112 opposite to the exposure area 114 is connected to another area. That is, the printed circuit board is formed in the sequence of the first area 111, the exposure area 113, the second area 112, the exposure area 113, and the other area. In this way, the housing can be designed in various forms.

Meanwhile, lots of heat may be generated in the printed circuit board 110 during use thereof. Heat is generally generated in the component 130, and may be generated in the fuses (not shown) electrically connected to a terminal 134. As the heat is transferred to the metal layer 116, it can be discharged more effectively to the outside. That is, since the metal layer 116 is formed along a relatively wide area, the generated heat can be transferred more efficiently to be removed.

Figure 6:
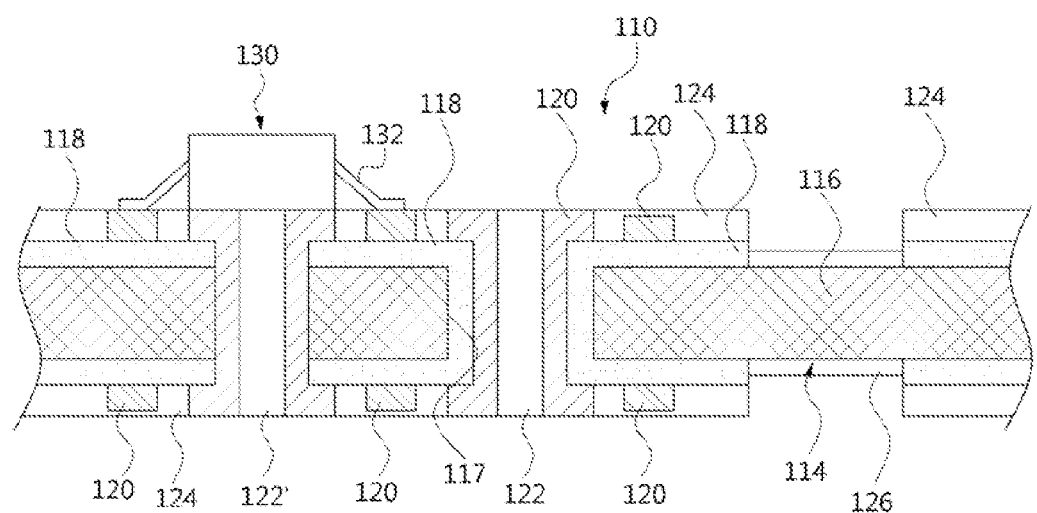
FIG. 6 is a sectional view showing an internal configuration of the printed circuit board of FIG. 5.

Since the plating layer formed on the inner surface of the through-hole 122' is exposed to a surface of the printed circuit board 110 and is integrally formed with the metal layer 116, the heat generated by the component 130 is transferred to the plating layer of the through-hole 122' as shown in FIG. 6 and is transferred to the metal layer 116 again.

The terminal 134 may receive heat generated by a counterpart component. The heat is also transferred to the metal layer 116 through the circuit pattern 120 and the insulation layer 118. In particular, since the metal layer 116 is located in almost all the areas of the printed circuit board 110 other than the through portion 117 or the through-hole 122', a capacity of the metal layer 116 by which heat is absorbed and dissipated can be improved. Accordingly, since heat is not accumulated at a specific location of the printed circuit board 110 but is transferred to the entire metal layer 116, a phenomenon of increasing a temperature of a specific portion can be avoided.

For reference, in the case of three divided areas 111, 111', and 112 as shown in FIG. 8, three separate printed circuit boards should be generally used. However, the three areas 111, 111', and 112 can be integrally formed in the present invention. If the entire printed circuit board 110 is integrally formed in this way, the number of components of a product to which the printed circuit board 110 is applied can be reduced. That is, the number of components can be reduced by integrally forming the printed circuit board 110 and a total number of components can be reduced by deleting a configuration for electrically connecting printed circuit boards.

Next, in the exposure area 114 which is bent in the present invention, only the metal layer 116 can be exposed without the insulation layer 118 or the circuit pattern 120. Thus, if the metal layer 116 formed of a metal is exposed to an external environment, it may be corroded easily, in which case the metal layer 116 is prevented from contacting the external environment by attaching the shield film 126 or applying a moisture-proof agent to the metal layer 116 in the present invention. Thus, the metal layer 116 acting as the exposure area 114 can be shielded from an external environment by the shield film 126 or the moisture-proof agent to maintain its original characteristics for a long time and increase durability while the bending characteristics are sufficiently shown.

The exposure area 114 of the printed circuit board 110 of the present invention where a surface of the metal layer 116 is covered by the shield film 126 which is a polyimide film is bent to be curved, making it possible to form the first area 111 and the second area 112 at a predetermined angle.

Then, the shield film 126 is attached to a surface of the exposure area 114 before various components 130 and terminals 134 and 134' are mounted to the printed circuit board 110. That is, polyimide films are attached to opposite surfaces of the metal layer 116 exposed to the outside in the printed circuit board 110 where the component 130 and the terminals 134 and 134' are not mounted. The polyimide films are bonded to the surfaces of the metal layer 116 by applying heat and pressure while being positioned on the metal layer 116.

Next, after the component 130 or the terminals 134 and 134' are mounted to the printed circuit board 110, soldering is performed. Here, the printed circuit board 110 is exposed to a high temperature in the process of soldering the component 130 or the terminals 134 and 134', in which case the polyimide films are not influenced by the high temperature due to its excellent heat-resisting property.

For reference, the exposure area 114 may be bent after the polyimide films 126 are bonded or the component 130 or the terminals 134 and 134' are mounted, in which case the polyimide film on a surface of the exposure area 114 is expanded to become thinner than the original shape in the process of bending the exposure area 114. However, the polyimide film on an opposite surface of the exposure area 114 is contracted to become thicker. Of course, since the thicknesses of the polyimide films 126 have been determined in advance, considering the situation, the thicknesses of the polyimide films on the opposite surfaces of the exposure area 114 can be substantially constant.

The polyimide films serve to protect the metal layer 116 of the exposure area 114. In particular, as the polyimide films are attached to the exposure area 114 before soldering, the metal layer 116 is not influenced by a high temperature in the soldering process.

Further, when the printed circuit board 110 is installed in a specific product to be used, it is influenced by a surrounding environment. However, since the polyimide films are attached to the metal layer 116 of the exposure area 114, the metal layer 116 is prevented from being influenced by a surrounding environment to be corroded or deteriorated.

The scope of the present invention is not limited to the above-described embodiment but defined by the claims, and it is apparent that those skilled in the art to which the present invention pertains can variously modify and revise the present invention without departing from the scope of the present invention.

For example, the second area 32 and the second printed circuit board 50 are electrically connected to each other by the jumper pins 38 in the embodiment. However, wires or flexible cables may be used instead of the jumper pins 38. Of course, the second printed circuit board 50 is not inevitably necessary. That is, a function of the second printed circuit board 50 may not be implemented by the board block, or may be performed by the first printed circuit board 50.

Further, an angle between the first area 31 and the second area 32 of the first printed circuit board 30 may not be the right angle but may be varied according to the shapes of the housing body 12 and the housing cover 20, and the first area 31 and the second area 32 may be located on the same plane.

In addition, the input connector unit 52 is provided in the second area 32 in the embodiment, but may be provided in the first area 31 together with the first connector unit 16.

Furthermore, the area 111, 111', and 112 are rectangles in the embodiment, but may be triangles. That is, the areas may be triangles if the exposure area 114 is formed to connect peripheries adjacent to one corner portion of the first area 111. Further, the remaining peripheries of the areas 111, 111', and 112 other than the exposure area 114 may have various shapes. Although only rectangular shapes have been illustrated in the embodiment, various shapes such as semicircular curves and portions of polygons are possible.

The invention claimed is:

1. A printed circuit board comprising:
a first area having an insulation layer formed on a surface of a metal layer formed of a metal and a first circuit pattern formed in the insulation layer;
a second area provided separately from the first area and having a separate insulation layer formed on a surface of the metal layer and a second circuit pattern formed in the separate insulation layer; and
an exposure area formed between the first area and the second area and from which the metal layer is exposed,
wherein an input connector terminal constituting an input connector unit for supplying electric power to the metal layer is provided in any one of the first area and the second area,
wherein a component coupling terminal to which electric power is supplied through the metal layer and the first circuit pattern is provided in the first area, and a first connector terminal of a first connector unit electrically connected to the component coupling terminal is provided on a surface of the first area opposite to the surface on which the component coupling terminal is provided, and wherein a microchip to which electric power is supplied through the metal layer and the second circuit pattern is provided in the second area and a second connector terminal of a second connector unit electrically connected to the microchip.

2. The printed circuit board as claimed in claim 1, wherein the first connector terminal, the input connector terminal, and the second connector terminal are located on the surfaces of the first area and the second area which can be viewed by each other.

3. The printed circuit board as claimed in claim 1, wherein the exposure area is bent at a predetermined angle such that the first area and the second area are connected to each other at a predetermined angle.

4. The printed circuit board as claimed in claim 3, wherein a fuse is coupled to the component coupling terminal of the first area, and a microchip is mounted to the second area to generate a control signal.

5. A printed circuit board comprising:
a metal layer formed of a metal; and
an insulation layer and a circuit pattern layer formed on a surface of the metal layer,
wherein the insulation layer and the circuit pattern layer are divided into a first area and a second area with respect to an exposure area from which the metal layer is exposed, wherein a component coupling terminal for coupling a fuse is installed on one surface of the first area, a first connector terminal constituting a first connector unit is installed on an opposite surface of the first area, and a first circuit pattern for supplying electric power transferred through the metal layer to the first connector terminal via the fuse is provided, and wherein a microchip is mounted to one surface of the second area to control electric power transferred through the metal layer, and a second circuit pattern for supplying a control signal output from the microchip to a second connector terminal provided in the second area is provided.

6. The printed circuit board as claimed in claim 5, wherein electric power is supplied from the fuse to the microchip through the metal layer, and external electric power is supplied to the metal layer through an input connector unit.

7. The printed circuit board as claimed in claim 5, wherein the exposure area is bent at a predetermined angle such that the first area and the second area are connected to each other at a predetermined angle.

8. The printed circuit board as claimed in claim 7, wherein the input connector unit is disposed parallel to the first connector unit or the second connector unit installed in the first area or the second area.

9. A printed circuit board having a metal layer formed of a metal material, insulation layers formed on opposite surfaces of the metal layer, and circuit patterns formed on the insulation layers, the printed circuit board comprising:
an exposure area from which opposite peripheries of the metal layer and a surface between the peripheries are exposed to the outside;
a first area connected to one side of the exposure area via the metal layer, the insulation layers and the circuit patterns being formed on the opposite surfaces of the metal layer; and
a second area connected to an opposite side of the exposure area via the metal layer, the insulation layers and the circuit patterns being formed on the opposite surfaces of the metal layer,
wherein the metal layer of the exposure area is bent such that imaginary extension planes of the first area and the second area form a predetermined angle.

10. The printed circuit board as claimed in claim 9, wherein a separate exposure area is formed along a section of at least one of the first area and the second area, and another area is provided to have a predetermined angle with the imaginary extension planes of the first and second areas.

11. The printed circuit board as claimed in claim 10, wherein a portion of the exposure area connecting the opposite peripheries of the metal layer is linear.

12. The printed circuit board as claimed in claim 9, wherein through portions are formed at portions of the metal layer corresponding to the first and second areas to form the insulation layers, a through hole passes through the insulation layers provided in the through portions, and the circuit patterns formed on the opposite surfaces of the insulation layers are electrically connected to each other by a plating layer formed on an inner surface of the through-hole.

13. The printed circuit board as claimed in claim 12, wherein a through-hole is further formed to pass through the metal layer and the insulation layers surrounding the metal layer, and the plating layer is formed on the inner surface of the through-hole such that the metal layer and the plating layer are integrally formed.

14. The printed circuit board as claimed in claim 13, wherein shield films are attached to surfaces of the exposure area or a moisture-proof agent is applied to the surfaces of the exposure area.

15. The printed circuit board as claimed in claim 14, wherein the shield films are polyimide films, the polyimide films having different thicknesses are attached to the opposite surfaces of the exposure area, and the thicknesses of the polyimide films are made to be the same as the polyimide films on one surface of the exposure area becomes thinner when the exposure area is bent and the polyimide films on an opposite surface of the exposure area becomes thicker when the exposure area is bent.

16. A board block for vehicles, comprising:

a housing having an interior space;

a first printed circuit board installed within the housing and having a first area and a second area divided by an exposure area from which a metal layer is exposed such that surfaces of the first and second areas face an inner surface of the housing, wherein a circuit pattern is formed on an insulation layer of the metal layer;

a first connector unit installed in the first area of the first printed circuit board and a tip end of which faces a lower side of the housing; and a second connector unit installed in the second area of the first printed circuit board and a tip end of which faces the lower side of the housing, wherein an input connector unit for supplying electric power to the metal layer is installed in the second area of the first printed circuit board.

17. The board block as claimed in claim 16, further comprising a center board having a first area mounting unit and a second area mounting unit coupled to the first area and the second area of the first printed circuit board, respectively, wherein a second printed circuit board is further installed in the center board and electric power is supplied to the second printed circuit board through a jumper pin installed in the second area.

18. The board block as claimed in claim 17, wherein a component coupling terminal for coupling to a fuse is installed on one surface of the first area, a first connector terminal constituting the first connector unit is installed on an opposite surface of the first area, and a first circuit pattern for supplying the electric power transferred through the metal layer to the first connector terminal via the fuse is provided, and wherein a microchip is mounted to one surface of the second area to control the electric power transferred through the metal layer, and a second circuit pattern for supplying a control signal output from the microchip to a second connector terminal provided in the second area.

* * * * *